(12) United States Patent
Zhang et al.

(10) Patent No.: US 9,595,696 B2
(45) Date of Patent: Mar. 14, 2017

(54) OPERATING PLATFORM

(71) Applicant: SHENZHEN CHINA STAR OPTOELECTRONICS TECHNOLOGY CO., LTD., Shenzhen, Guangdong (CN)

(72) Inventors: Fan Zhang, Shenzhen (CN); Wei Yu, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 97 days.

(21) Appl. No.: 14/417,218

(22) PCT Filed: Aug. 1, 2014

(86) PCT No.: PCT/CN2014/083580
§ 371 (c)(1),
(2) Date: Jan. 26, 2015

(87) PCT Pub. No.: WO2016/004660
PCT Pub. Date: Jan. 14, 2016

(65) Prior Publication Data
US 2016/0013452 A1    Jan. 14, 2016

(30) Foreign Application Priority Data
Jul. 10, 2014    (CN) .......................... 2014 1 0326756

(51) Int. Cl.
*B01L 1/02*         (2006.01)
*B05D 5/12*        (2006.01)
(Continued)

(52) U.S. Cl.
CPC .............. *H01L 51/56* (2013.01); *B01D 46/44* (2013.01); *B01D 46/446* (2013.01);
(Continued)

(58) Field of Classification Search
CPC ......... B05D 5/12; C23C 16/00; C23C 16/455; G01N 15/08; B01L 1/04; H02K 49/10
(Continued)

(56) References Cited

U.S. PATENT DOCUMENTS

2010/0294024 A1* 11/2010 Kumar .................. B82Y 20/00
                                                         73/38
2010/0314960 A1* 12/2010 Polsky ................... A61G 10/02
                                                         310/104
(Continued)

FOREIGN PATENT DOCUMENTS

KR        100925383      * 10/2009    ............... B01L 1/02

*Primary Examiner* — Jacob T Minskey
*Assistant Examiner* — Minh-Chau Pham

(57) ABSTRACT

An operating platform includes a first sensing assembly and a gas supply device. The gas supply device includes a second sensing assembly configured to detect the water content and oxygen content of a protective gas inputted from an input terminal; and a first electromagnetic valve. With the use of more than one sensing assemblies, the water content and the oxygen content of the protective gas provided by the gas supply device can be further detected, so as to solve the problems of inaccurate detected values and abnormalities.

14 Claims, 4 Drawing Sheets

(51) Int. Cl.
   *C23C 16/00*    (2006.01)
   *G01N 15/08*    (2006.01)
   *C23C 16/455*   (2006.01)
   *B01L 1/04*     (2006.01)
   *H02K 49/10*    (2006.01)
   *H01L 51/56*    (2006.01)
   *B01D 46/44*    (2006.01)
   *B65B 55/02*    (2006.01)
   *H01L 51/00*    (2006.01)
   *H01L 51/52*    (2006.01)
   *B65B 31/02*    (2006.01)

(52) U.S. Cl.
   CPC ............ *B65B 55/027* (2013.01); *B65B 31/02* (2013.01); *H01L 51/0029* (2013.01); *H01L 51/5237* (2013.01)

(58) Field of Classification Search
   USPC .............. 55/385.2; 73/38; 118/723 R, 715; 427/58; 310/104; 96/397; 414/806
   See application file for complete search history.

(56) References Cited

U.S. PATENT DOCUMENTS

2011/0126498 A1* 6/2011 Polsky ............... G01R 33/0047
                                                    55/385.2
2013/0269608 A1* 10/2013 Soderlund .......... H01L 21/6719
                                                    118/715

* cited by examiner

OPERATING PLATFORM

FIELD OF THE INVENTION

The present invention relates to a technology for an organic light emitting diode (OLED) packaging process, and more particularly to an operating platform.

BACKGROUND OF THE INVENTION

Since OLED technology is developing rapidly, a large amount of research is developed around OLED technology. As one of the key technologies of OLED technology, OLED packaging technology has become one of the hot research topics.

Due to the special optical properties of the material of OLED devices, it is required to package OLED devices in a glove box with a low oxygen environment. If the water in a high concentration or oxygen enters into the glove box, the OLED devices will be damaged, thereby affecting a lifetime thereof.

The glove box is a laboratory equipment with a high-purity inert gas filled therein, and the active substance can be filtered from the glove box, namely an inert gas tank or a dry box for removing $O_2$, $H_2O$, and organic gas. The glove box is widely used to provide a dry, oxygen-free and dust-free environment for lithium-ion batteries, semiconductors, super-capacitors, special lights, laser welding, or brazing.

Therefore, the OLED packaging process is required to be performed in an environment with a low concentration of moisture or oxygen (such as less than 10 ppm). In general, a nitrogen gas is provided into the glove box in the OLED packaging process. Since the glove box is not a confined space, when a pressure in the glove box is reduced, moisture or oxygen molecules in the air will penetrate into the glove box, and a purification device or purification system is required to purify the protective gas in the glove box, so as to maintain a low-moisture and low-oxygen environment.

FIG. 1 is a schematic diagram showing a conventional purification device.

The conventional purification device comprises an inlet filter 21, a valve 22, a purification unit (or reactor) 23, a circulating blower 24, a cooler 25, and an outlet filter 26. Under the influence of the circulating blower 24 disposed outside, the purification unit 2 continuously purifies the protective gas in the glove box 1, so as to maintain the moisture and oxygen in the glove box 1 below 10 ppm.

When a concentration value of the moisture or oxygen in the glove box 1 detected by a sensing assembly (including an oxygen sensor 41 and a moisture sensor 42) is greater than 10 ppm, a purging process is performed for the glove box in an operating platform. Namely, the protective gas is provided for the glove box by a gas supply device 3, thereby reducing a concentration of moisture or oxygen in the glove box 1.

However, in the conventional operating platform, if the protective gas provided from the gas supply device 3 has a high concentration of moisture or oxygen, it cannot be detected by the conventional operating platform. Furthermore, the purification device 2 comprises only one sensing assembly. When a gas leak occurs in the glove box 1 or the purification device 2, or when a sensitivity of the sensor is reduced, resulting in an inaccurate detected value, the high concentration of moisture or oxygen in the glove box 1 cannot be detected.

As a result, it is necessary to improve the conventional operating platform, so as to solve the problems existing in the conventional technologies as described above.

SUMMARY OF THE INVENTION

The present invention provides an operating platform for solving the problem existing in the conventional technologies that the conventional operating platform cannot detect the water content and the oxygen content of the protective gas provided by the gas supply device. Even when the sensing assembly is not sensitive enough, or a gas leak occurs in the purification device, resulting in an inaccurate detected result, the abnormality of the water content and the oxygen content can be detected.

A primary object of the present invention is to provide an operating platform, comprising: an operating space configured to provide an operating environment for at least one object to be operated, wherein at least one protective gas is provided in the operating space, and the protective gas is configured to protect the object to be operated on from oxidation or corrosion; a purification device configured to purify the protective gas in the operating space, wherein the purification device comprises a gas input terminal and a gas output terminal; a first sensing assembly disposed at the gas input terminal of the purification device for detecting a water content and an oxygen content of the protective gas in the operating space; a gas supply device configured to supply the protective gas for the operating space when the first sensing assembly detects that the water content of the protective gas is greater than a first threshold value or that the oxygen content of the protective gas is greater than a second threshold value, wherein the gas supply device comprises: an input terminal for inputting the protective gas; an output terminal configured to output the protective gas to the operating space; a second sensing assembly configured to detect the water content and the oxygen content of the protective gas inputted from the input terminal; a first electromagnetic valve disposed between the output terminal and the input terminal, wherein the first electromagnetic valve is configured to control the gas supply device to output the protective gas to the operating space according to a detected result of the second sensing assembly, and the first electromagnetic valve is disposed between the second sensing assembly and the output terminal; and a second electromagnetic valve disposed between the second sensing assembly and the input terminal.

In the operating platform of the present invention, when the first electromagnetic valve is turned on, and the second electromagnetic valve is turned off, the second sensing assembly is configured to detect the water content and the oxygen content of the protective gas outputted from the gas output terminal of the purification device.

In the operating platform of the present invention, the output terminal of the gas supply device is connected to the gas output terminal of the purification device.

In the operating platform of the present invention, the gas supply device further comprises a filter film, and the filter film is connected between the second electromagnetic valve and the second sensing assembly.

In the operating platform of the present invention, when the second sensing assembly detects that the water content of the protective gas inputted from the input terminal is greater than a third threshold value or that the oxygen content of the protective gas inputted from the input terminal is greater than a fourth threshold value, the first electromagnetic valve is turned off.

In the operating platform of the present invention, the operating platform further comprises a pressure detector, and when a difference between a pressure of the protective gas detected by the pressure detector and 1 atmospheric pressure (atm) is less than a predetermined value, the gas supply device outputs the protective gas to the operating space.

In the operating platform of the present invention, the predetermined value is in a range of 1 mbar to 2 mbar.

In the operating platform of the present invention, the protective gas is a nitrogen gas.

Another object of the present invention is to provide an operating platform, comprising: an operating space configured to provide an operating environment for at least one object to be operated, wherein at least one protective gas is provided in the operating space, and the protective gas is configured to protect the object to be operated from oxidation or corrosion; a purification device configured to purify the protective gas in the operating space, wherein the purification device comprises a gas input terminal and a gas output terminal; a first sensing assembly disposed at the gas input terminal of the purification device for detecting a water content and an oxygen content of the protective gas in the operating space; a gas supply device configured to supply the protective gas for the operating space when the first sensing assembly detects that the water content of the protective gas is greater than a first threshold value or the oxygen content of the protective gas is greater than a second threshold value, wherein the gas supply device comprises: an input terminal for inputting the protective gas; an output terminal configured to output the protective gas to the operating space; a second sensing assembly configured to detect the water content and the oxygen content of the protective gas inputted from the input terminal; and a first electromagnetic valve disposed between the output terminal and the input terminal, wherein the first electromagnetic valve is configured to control the gas supply device to output the protective gas to the operating space according to a detected result of the second sensing assembly.

In the operating platform of the present invention, the first electromagnetic valve is disposed between the second sensing assembly and the output terminal.

In the operating platform of the present invention, a second electromagnetic valve disposed between the second sensing assembly and the input terminal.

In the operating platform of the present invention, when the first electromagnetic valve is turned on, and the second electromagnetic valve is turned off, the second sensing assembly is configured to detect the water content and the oxygen content of the protective gas outputted from the gas output terminal of the purification device.

In the operating platform of the present invention, the output terminal of the gas supply device is connected to the gas output terminal of the purification device.

In the operating platform of the present invention, the gas supply device further comprises a filter film, and the filter film is connected between the second electromagnetic valve and the second sensing assembly.

In the operating platform of the present invention, when the second sensing assembly detects that the water content of the protective gas inputted from the input terminal is greater than a third threshold value or the oxygen content of the protective gas inputted from the input terminal is greater than a fourth threshold value, the first electromagnetic valve is turned off.

In the operating platform of the present invention, the operating platform further comprises a pressure detector, and when a difference between a pressure of the protective gas detected by the pressure detector and 1 atm is less than a predetermined value, the gas supply device outputs the protective gas to the operating space.

In the operating platform of the present invention, the predetermined value is in a range of 1 mbar to 2 mbar.

In the operating platform of the present invention, the protective gas is a nitrogen gas.

With the use of more than one sensing assemblies, the operating platform of the present invention can detect the water content and the oxygen content of the protective gas provided by the gas supply device for improving the detection accuracy, so as to detect abnormalities of the water content and the oxygen content.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The following embodiments are referring to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 1:
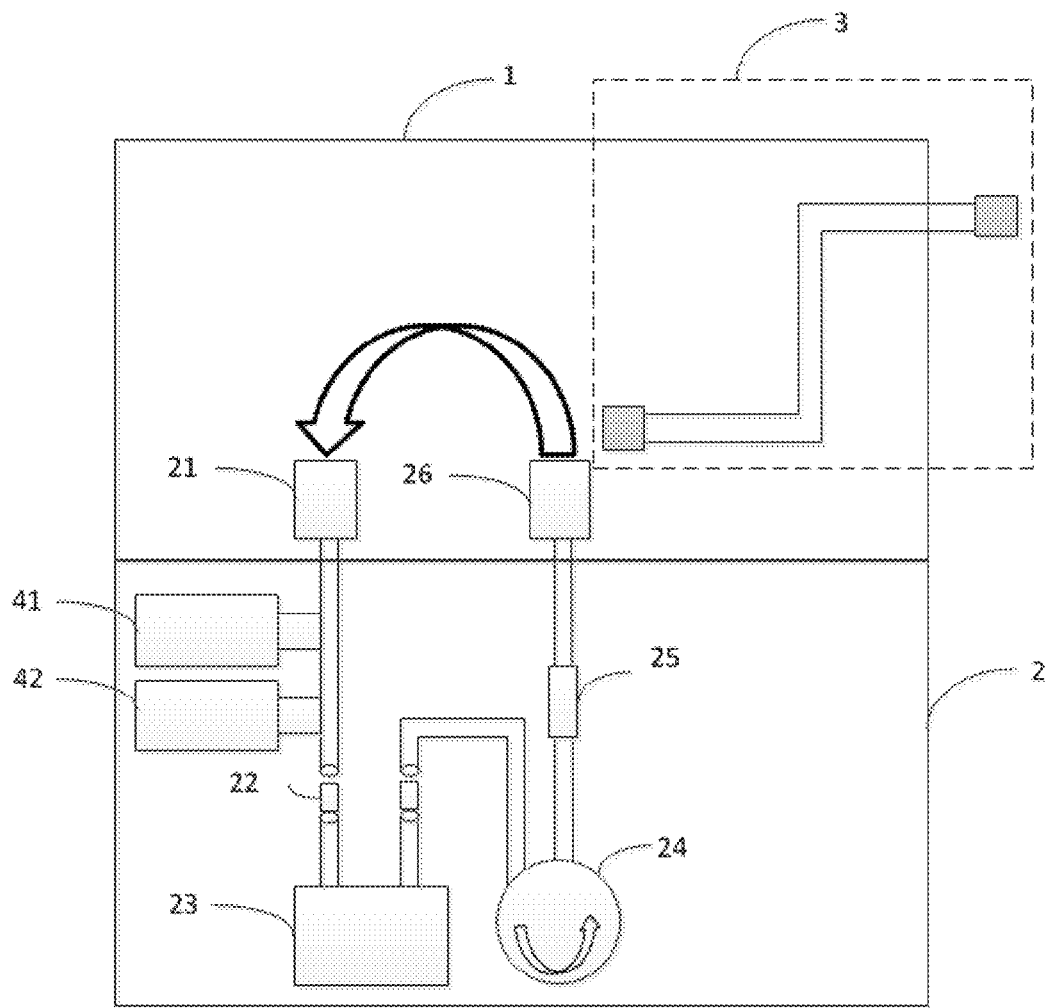
FIG. 1 is a schematic diagram showing a conventional operating platform.
Figure 2:
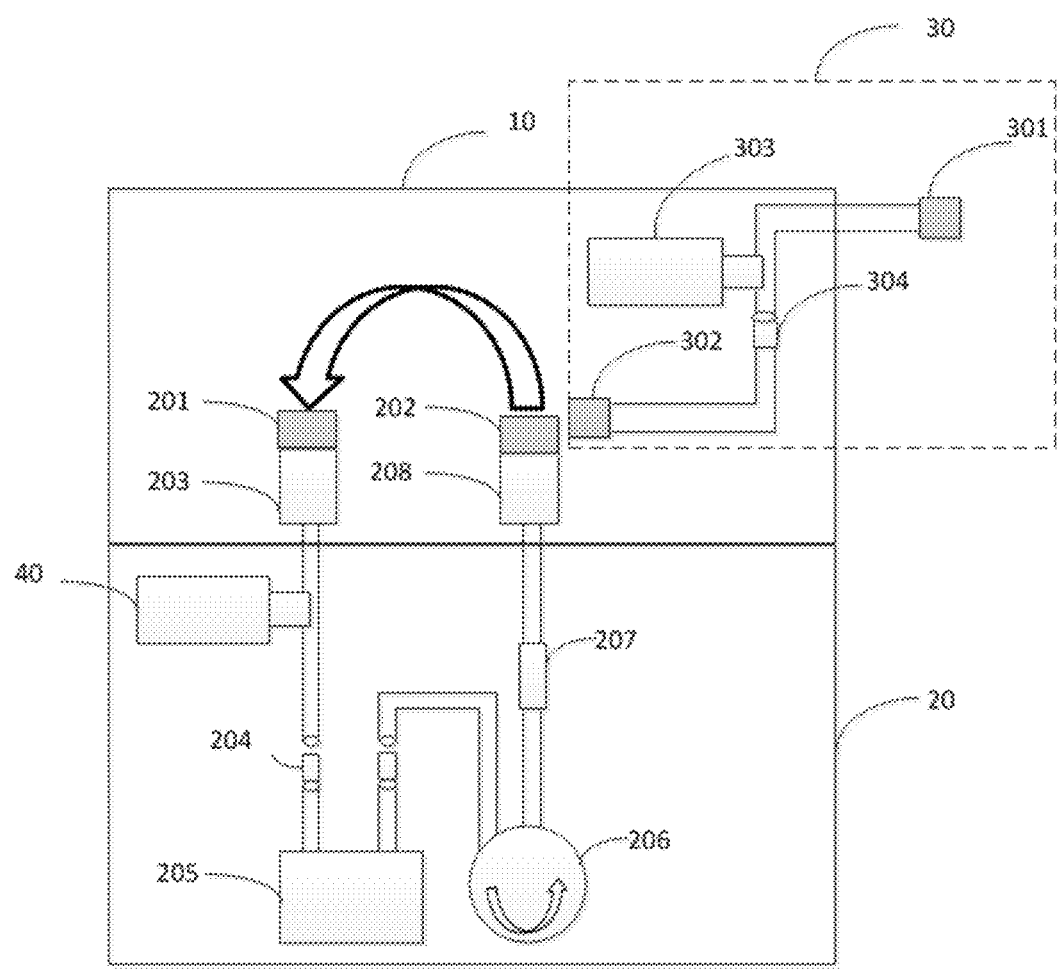
FIG. 2 is a schematic diagram showing an operating platform according to a first embodiment of the present invention.

FIG. 2 is a schematic diagram showing an operating platform according to a first embodiment of the present invention.

Referring to FIG. 2, the operating platform comprises an operating space 10, a purification device 20, a first sensing assembly 40, and a gas supply device 30.

The operating space 10 is configured to provide an operating environment for at least one object to be operated on, and at least one protective gas is provided in the operating space 10, wherein the protective gas is configured to protect the object to be operated from oxidation or corrosion. The operating space 10 may be a glove box for an OLED package process, and the object to be operated may be at least one OLED device.

The purification device 20 is configured to purify the protective gas in the operating space 10. The purification device 20 comprises a gas input terminal 201 and a gas output terminal 202, wherein the protective gas in the operating space 10 is purified by the purification device 20 from the gas input terminal 201 and outputted from the gas output terminal 202. The purification device 20 further comprises an inlet filter 203, a valve 204, a purification unit (or reactor) 205, a circulating blower 206, a cooler 207, and an outlet filter 208.

The first sensing assembly 40 comprises a moisture sensor and an oxygen sensor disposed at the gas input terminal 201 of the purification device for detecting the water content and the oxygen content of the protective gas in the operating space 10.

Since the purification device 20 has a limited capacity to purify the protective gas, when the water content or the oxygen content of the protective gas is increased, the protective gas cannot be efficiently purified by the purification device 20 alone. In order to reduce production costs, the gas supply device 30 is required to supply more protective gas into the operating space 10, namely purging. That is, when the first sensing assembly 40 detects that the water content of the protective gas (in the operating space 10) is greater than a first threshold value or that the oxygen content of the protective gas is greater than a second threshold value, the gas supply device 30 supplies the protective gas for the operating space 10. For example, the first threshold value may be 10 ppm, and the second threshold value may be 10 ppm, but they are not limited thereto. The first threshold value and the second threshold value can be determined according to the operating environment for the at least one object to be operated on.

The gas supply device 30 comprises an input terminal 301 and an output terminal 302, and the input terminal 301 is connected to a protective gas tank for inputting the protective gas, and the output terminal 302 is configured to output the protective gas to the operating space 10.

The gas supply device 30 further comprises a second sensing assembly 303 and a first electromagnetic valve 304, and the second sensing assembly 303 includes a moisture sensor and an oxygen sensor for detecting the water content and oxygen content of the protective gas inputted from the input terminal 301.

The first electromagnetic valve 304 is disposed between the output terminal 302 and the input terminal 301. The first electromagnetic valve 304 is configured to control the gas supply device 30 to output the protective gas to the operating space 10 according to a detected result of the second sensing assembly 303.

Preferably, the first electromagnetic valve 304 is disposed between the second sensing assembly 303 and the output terminal 302.

When the second sensing assembly 303 detects that the water content of the protective gas inputted from the input terminal 301 is greater than a third threshold value or that the oxygen content of the protective gas inputted from the input terminal 301 is greater than a fourth threshold value, the first electromagnetic valve 304 is turned off, and the gas supply device 30 is unable to output the protective gas to the operating space 10. In this case, the third threshold value is less than the first threshold value, and the fourth threshold value is less than the second threshold value.

When it is detected by the second sensing assembly 303 that the water content of the protective gas inputted from the input terminal 301 is less than the third threshold value and that the oxygen content of the protective gas inputted from the input terminal 301 is less than the fourth threshold value, the first electromagnetic valve 304 is turned on, and the gas supply device 30 is able to output the protective gas to the operating space 10.

Preferably, the operating platform further comprises a pressure detector. In general, a pressure of the protective gas in the operating space 10 is greater than 1 atmospheric pressure (atm). When a difference between the pressure of the protective gas detected by the pressure detector and 1 atm is less than a predetermined value, the gas supply device 30 outputs the protective gas to the operating space 10. The predetermined value may be in a range of 1 mbar to 2 mbar.

When the first sensing assembly 40 is not sensitive enough, or a gas leak occurs in the purification device 2, resulting the increasing of the water content and the oxygen content of the protective gas, the abnormality of the water content and the oxygen content can be detected by the second sensing assembly 303. When any one of the sensing assemblies detects that the water or the oxygen content of the protective gas is too high, an alarm or warning can be provided for a timely response to the abnormality of the water or oxygen content of the protective gas.

In this embodiment, the protective gas may be a nitrogen gas.

Figure 3:
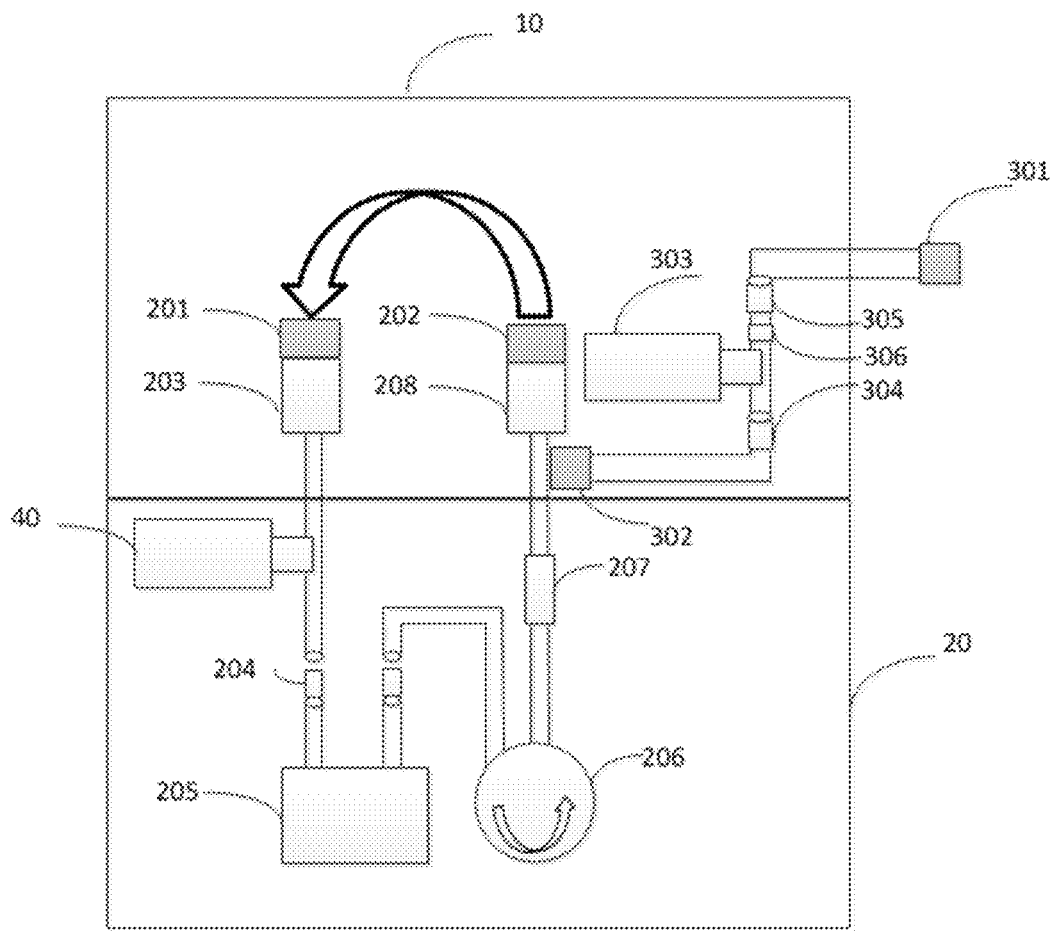
FIG. 3 is a schematic diagram showing a first connection of a gas supply device according to a second embodiment of the present invention.

FIG. 3 is a schematic diagram showing a first connection of a gas supply device according to a second embodiment of the present invention.

Referring to FIG. 3, the operating platform comprises the operating space 10, the purification device 20, the first sensing assembly 40, and the gas supply device 30.

The operating space 10 is configured to provide the operating environment for at least one object to be operated on, and at least one protective gas is provided in the operating space 10, wherein the protective gas is configured to protect the object to be operated on from oxidation or corrosion. The operating space 10 may be the glove box for the OLED packaging process, and the object to be operated may be the at least one OLED device.

The purification device 20 is configured to purify the protective gas in the operating space 10. The purification device 20 comprises the gas input terminal 201 and the gas output terminal 202, wherein the protective gas in the operating space 10 is purified by the purification device 20 from the gas input terminal 201 and outputted from the gas output terminal 202. The purification device 20 further comprises the inlet filter 203, the valve 204, the purification unit (or reactor) 205, the circulating blower 206, the cooler 207, and the outlet filter 208.

The first sensing assembly 40 comprises a moisture sensor and an oxygen sensor disposed at the gas input terminal 201 of the purification device for detecting the water content and the oxygen content of the protective gas in the operating space 10.

Since the purification device 20 has a limited capacity to purify the protective gas, when the water content or the oxygen content of the protective gas is increased, the protective gas cannot be efficiently purified by the purification device 20 alone. In order to reduce production costs, the gas supply device 30 is required to supply more protective gas into the operating space 10, namely purging. That is, when the first sensing assembly 40 detects that the water content of the protective gas in the operating space 10 is greater than the first threshold value or that the oxygen content of the protective gas is greater than the second threshold value, the gas supply device 30 supplies the protective gas for the operating space 10. For example, the first threshold value may be 10 ppm, and the second threshold value may be 10 ppm, but they are not limited thereto. The first threshold value and the second threshold value can be determined according to the operating environment for the at least one object to be operated.

The gas supply device 30 comprises the input terminal 301 and the output terminal 302, and the input terminal 301 is connected to a protective gas tank for inputting the protective gas, and the output terminal 302 is configured to output the protective gas to the operating space 10.

The gas supply device 30 further comprises the second sensing assembly 303 and the first electromagnetic valve 304, and the second sensing assembly 303 includes the moisture sensor and an oxygen sensor for detecting the water content and the oxygen content of the protective gas inputted from the input terminal 301.

The first electromagnetic valve 304 is disposed between the output terminal 302 and the input terminal 301. The first electromagnetic valve 304 is configured to control the gas supply device 30 to output the protective gas to the operating space 10 according to a detected result of the second sensing assembly 303.

Preferably, the first electromagnetic valve 304 is disposed between the second sensing assembly 303 and the output terminal 302.

When the second sensing assembly 303 detects that the water content of the protective gas inputted from the input terminal 301 is greater than a third threshold value or that the oxygen content of the protective gas inputted from the input terminal 301 is greater than a fourth threshold value, the first electromagnetic valve 304 is turned off, and the gas supply device 30 is unable to output the protective gas to the operating space 10. In this case, the third threshold value is less than the first threshold value, and the fourth threshold value is less than the second threshold value.

When it is detected by the second sensing assembly 303 that the water content of the protective gas inputted from the input terminal 301 is less than the third threshold value and that the oxygen content of the protective gas inputted from the input terminal 301 is less than the fourth threshold value, the first electromagnetic valve 304 is turned on, and the gas supply device 30 is able to output the protective gas to the operating space 10.

Preferably, the operating platform further comprises the pressure detector. In general, a pressure of the protective gas in the operating space 10 is greater than 1 atm. When a difference between the pressure of the protective gas detected by the pressure detector and 1 atm is less than a predetermined value, the gas supply device 30 outputs the protective gas to the operating space 10. The predetermined value may be in a range of 1 mbar to 2 mbar.

Compared with the first embodiment, in the second embodiment, the gas supply device 30 (the dotted line shown in FIG. 4) further comprises a second electromagnetic valve 305, and the second electromagnetic valve 305 is disposed between the second sensing assembly 303 and the input terminal 301.

Figure 4:
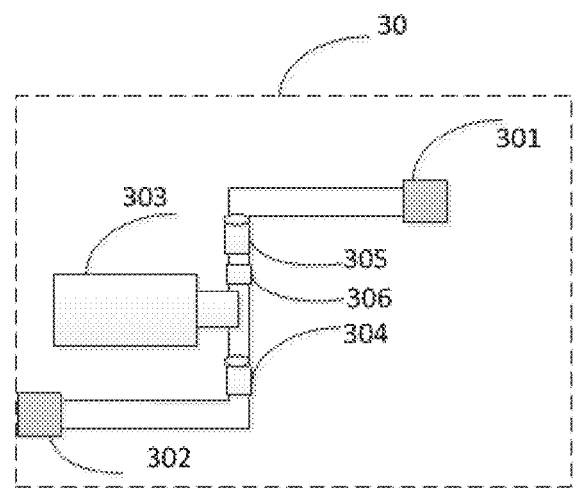
FIG. 4 is a schematic diagram showing the gas supply device according to the second embodiment of the present invention.
Figure 5:
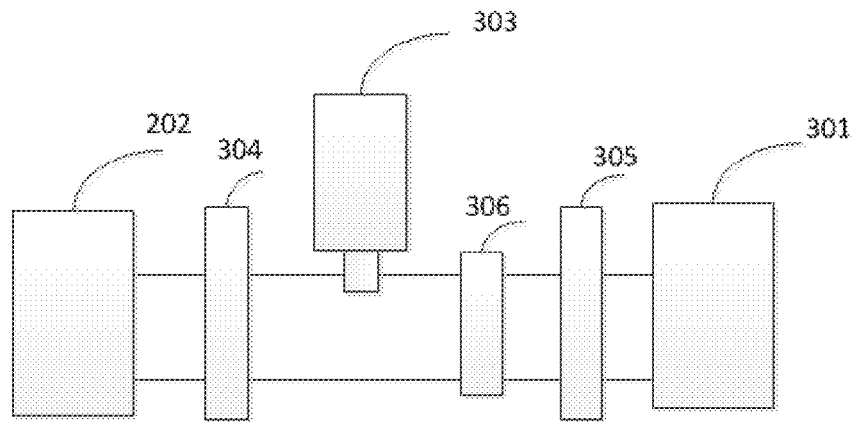
FIG. 5 is an enlarged view showing the first connection of the gas supply device according to the second embodiment of the present invention.

FIG. 4 is a schematic diagram showing the gas supply device according to the second embodiment of the present invention. FIG. 5 is an enlarged view showing the first connection of the gas supply device according to the second embodiment of the present invention.

When the protective gas is not provided for the operating space 10 by the gas supply device 30, the second electromagnetic valve 305 is turned off, and the first electromagnetic valve 304 is turned on. Since the output terminal 302 of the gas supply device 30 is connected to the gas output terminal 202 of the purification device 20, the protective gas from the gas output terminal 202 of the purification device 20 can flow through the output terminal 302 of the gas supply device 30, and the second sensing assembly 303 can detect the water content and the oxygen content of the protective gas purified by the purification device 20.

Figure 6:
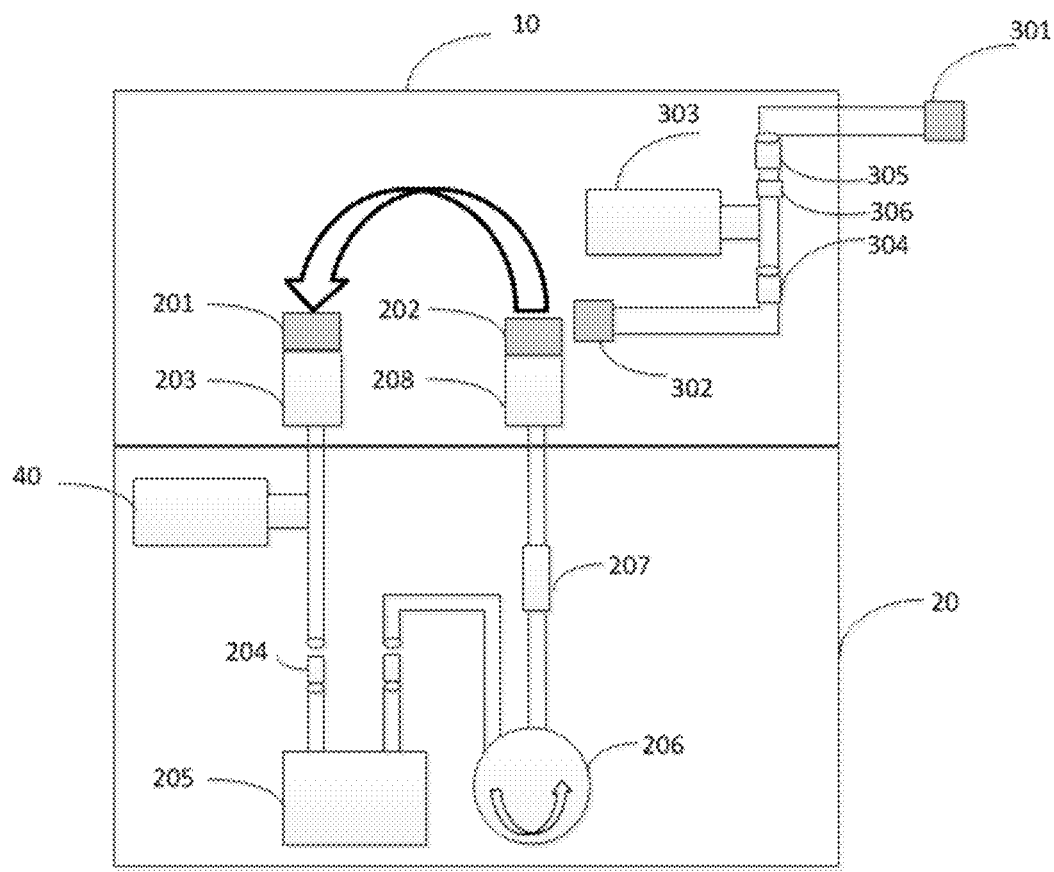
FIG. 6 is a schematic diagram showing a second connection of the gas supply device according to the second embodiment of the present invention.

FIG. 6 is a schematic diagram showing a second connection of the gas supply device according to the second embodiment of the present invention.

Referring to FIG. 6, the output terminal 302 of the gas supply device 30 may be disposed close to the gas output terminal 202 of the purification device 20. In this case, the second sensing assembly 303 can detect the water content and the oxygen content of the protective gas purified by the purification device 20.

When the first sensing assembly 40 is not sensitive enough, or a gas leak occurs in the purification device 2, resulting the increasing of the water content and the oxygen content of the protective gas, the abnormality of the water content and the oxygen content can be detected by the second sensing assembly 303. When any one of the sensing assemblies detects that the water or the oxygen content of the protective gas is too high, an alarm can be provided for a timely response to the abnormality of the water or the oxygen content of the protective gas.

Referring to FIG. 4 again, the gas supply device 30 further comprises a filter film 306, and the filter film 306 is connected between the second electromagnetic valve 305 and the second sensing assembly 303. The protective gas inputted from the gas supply device 30 may contain impurities and macromolecules (having a relative molecular mass more than 5,000) in the water and oxygen, and probes of the moisture sensor and oxygen sensor may be oxidized by the impurities and macromolecules in the water and oxygen. If the impurities and macromolecules in the water and oxygen are outputted into the operating space, the object to be operated on will be damaged. Therefore, the moisture sensor, the oxygen sensor and the object to be operated on can be protected by the filter film 306. In this embodiment, the protective gas may be a nitrogen gas.

In the operating platform of the present invention, with the use of the more than one sensing assemblies, the water content and oxygen content of the protective gas purified by the purification device can be further detected.

The present invention has been described with preferred embodiments thereof and it is understood that many changes and modifications to the described embodiments can be carried out without departing from the scope and the spirit of the invention that is intended to be limited only by the appended claims.

The invention claimed is:
1. An operating platform, comprising:
an operating space configured to provide an operating environment for at least one object to be operated on, wherein at least one protective gas is provided in the operating space, and the protective gas is configured to protect the object to be operated on from oxidation or corrosion;
a purification device configured to purify the protective gas in the operating space, wherein the purification device comprises a gas input terminal and a gas output terminal;
a first sensing assembly disposed at the gas input terminal of the purification device for detecting a water content and an oxygen content of the protective gas in the operating space;
a gas supply device configured to supply the protective gas for the operating space when the first sensing assembly detects that the water content of the protective gas is greater than a first threshold value or that the oxygen content of the protective gas is greater than a second threshold value, wherein the gas supply device comprises:
an input terminal for inputting the protective gas;
an output terminal configured to output the protective gas to the operating space;
a second sensing assembly configured to detect the water content and the oxygen content of the protective gas inputted from the input terminal;
a first electromagnetic valve disposed between the output terminal and the input terminal, wherein the first electromagnetic valve is configured to control the gas supply device to output the protective gas to the operating space according to a detected result of the second sensing assembly, and the first electromagnetic valve is disposed between the second sensing assembly and the output terminal; and
a second electromagnetic valve disposed between the second sensing assembly and the input terminal, wherein when the first electromagnetic valve is turned on, and the second electromagnetic valve is turned off, and the second sensing assembly is configured to detect the water content and the oxygen content of the protective gas outputted from the gas output terminal of the purification device.

2. The operating platform according to claim 1, wherein the output terminal of the gas supply device is connected to the gas output terminal of the purification device.

3. The operating platform according to claim 1, wherein the gas supply device further comprises a filter film, and the filter film is connected between the second electromagnetic valve and the second sensing assembly.

4. The operating platform according to claim 1, when the second sensing assembly detects that the water content of the protective gas inputted from the input terminal is greater than a third threshold value or that the oxygen content of the protective gas inputted from the input terminal is greater than a fourth threshold value, the first electromagnetic valve is turned off.

5. The operating platform according to claim 1, wherein the operating platform further comprises a pressure detector, and when a difference between a pressure of the protective gas detected by the pressure detector and 1 atmospheric pressure (atm) is less than a predetermined value, the gas supply device outputs the protective gas to the operating space.

6. The operating platform according to claim 5, wherein the predetermined value is in a range of 1 mbar to 2 mbar.

7. The operating platform according to claim 1, wherein the protective gas is a nitrogen gas.

8. An operating platform, comprising:
an operating space configured to provide an operating environment for at least one object to be operated on, wherein at least one protective gas is provided in the operating space, and the protective gas is configured to protect the object to be operated on from oxidation or corrosion;
a purification device configured to purify the protective gas in the operating space, wherein the purification device comprises a gas input terminal and a gas output terminal;
a first sensing assembly disposed at the gas input terminal of the purification device for detecting a water content and an oxygen content of the protective gas in the operating space;
a gas supply device configured to supply the protective gas for the operating space when the first sensing assembly detects that the water content of the protective gas is greater than a first threshold value or that the oxygen content of the protective gas is greater than a second threshold value, wherein the gas supply device comprises:
an input terminal for inputting the protective gas;
an output terminal configured to output the protective gas to the operating space;
a second sensing assembly disposed between the output terminal and the input terminal;
a first electromagnetic valve disposed between the output terminal and second sensing assembly, wherein the first electromagnetic valve is configured to control the gas supply device to output the protective gas to the operating space according to a detected result of the second sensing assembly; and
a second electromagnetic valve disposed between the second sensing assembly and the input terminal;
wherein when the first electromagnetic valve and the second electromagnetic valve are turned on, the second sensing assembly is configured to detect the water content and oxygen content of the protective gas inputted from the input terminal, when the first electromagnetic valve is turned on, and the second electromagnetic valve is turned off, the second sensing assembly is configured to detect the water content and oxygen content of the protective gas outputted from the gas output terminal of the purification device.

9. The operating platform according to claim 8, wherein the output terminal of the gas supply device is connected to the gas output terminal of the purification device.

10. The operating platform according to claim 8, wherein the gas supply device further comprises a filter film, and the filter film is connected between the second electromagnetic valve and the second sensing assembly.

11. The operating platform according to claim 8, when the second sensing assembly detects that the water content of the protective gas inputted from the input terminal is greater than a third threshold value or that the oxygen content of the protective gas inputted from the input terminal is greater than a fourth threshold value, the first electromagnetic valve is turned off.

12. The operating platform according to claim 8, wherein the operating platform further comprises a pressure detector, and when a difference between a pressure of the protective gas detected by the pressure detector and 1 atm is less than a predetermined value, the gas supply device outputs the protective gas to the operating space.

13. The operating platform according to claim 12, wherein the predetermined value is in a range of 1 mbar to 2 mbar.

14. The operating platform according to claim 8, wherein the protective gas is a nitrogen gas.

* * * * *